United States Patent
You et al.

(10) Patent No.: US 8,811,016 B2
(45) Date of Patent: Aug. 19, 2014

(54) POWER CONVERTER DEVICE

(75) Inventors: Pei-Ai You, Shanghai (CN); Gang Liu, Shanghai (CN); Jin-Fa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 209 days.

(21) Appl. No.: 13/491,044

(22) Filed: Jun. 7, 2012

(65) Prior Publication Data
US 2013/0223011 A1 Aug. 29, 2013

(30) Foreign Application Priority Data
Feb. 24, 2012 (CN) .......................... 2012 1 0044467

(51) Int. Cl.
*H05K 7/20* (2006.01)
(52) U.S. Cl.
USPC ........... 361/702; 361/689; 361/698; 361/699; 361/703; 165/80.3; 165/80.4
(58) Field of Classification Search
None
See application file for complete search history.

(56) References Cited

U.S. PATENT DOCUMENTS

| | | | |
|---|---|---|---|
| 7,272,015 B2 * | 9/2007 | Karrer et al. | 361/790 |
| 7,742,303 B2 * | 6/2010 | Azuma et al. | 361/699 |
| 7,830,689 B2 * | 11/2010 | Nakamura et al. | 363/141 |
| 7,948,758 B2 * | 5/2011 | Buhler et al. | 361/702 |
| 7,965,510 B2 * | 6/2011 | Suzuki et al. | 361/699 |
| 8,240,411 B2 * | 8/2012 | Nakatsu et al. | 180/65.21 |
| 8,376,069 B2 * | 2/2013 | Nakatsu et al. | 180/65.21 |
| 8,422,235 B2 * | 4/2013 | Azuma et al. | 361/736 |
| 8,472,188 B2 * | 6/2013 | Horiuchi et al. | 361/699 |
| 2009/0040724 A1 * | 2/2009 | Nishikimi et al. | 361/699 |
| 2013/0039009 A1 * | 2/2013 | Shin et al. | 361/699 |

\* cited by examiner

*Primary Examiner* — Boris Chervinsky
(74) *Attorney, Agent, or Firm* — CKC & Partners Co., Ltd.

(57) ABSTRACT

A power converter device is disclosed herein. The power converter device includes a printed wiring board assembly, a cold plate base and a shell plate assembly. The cold plate base is fastened under the printed wiring board assembly for dissipating heat generated by the printed wiring board assembly. The shell plate assembly having a top shell plate, a bottom shell plate, at least two side plates respectively mounted on the cold plate base in different orientations. The printed wiring board assembly and the cold plate base are enclosed with the shell plate assembly.

18 Claims, 7 Drawing Sheets

POWER CONVERTER DEVICE

RELATED APPLICATIONS

This application claims priority to Chinese Application Serial Number 201210044467.7, filed Feb. 24, 2012, which is herein incorporated by reference.

BACKGROUND

1. Technical Field

The present disclosure relates to power electronic, and more particularly, a power converter device.

2. Description of Related Art

FIG. 1 is a stereogram of a conventional DC/DC converter 100. As illustrated in FIG. 1, the DC converter 100 includes a cold plate base 110 and a printed wiring board assembly 120 which includes a printed wiring board 121 and electronic components (such as the transistor tube 131, transformer 132, choke 133, etc.) disposed on a first surface of the printed wiring board 121. In this architecture, the back surface of the printed wiring board 121 faces the cold plate base 110 such that the electronic components 131-133 are separated from the cold plate base 110 by the printed wiring board 121 thereby diminishing the heat dissipation efficiency.

In addition, the electronic components 131-133 are levelly disposed on the printed wiring board 121 and thereby occupy more space on the first surface. This would result in a bulkier volume of the DC/DC converter 100, which goes against the current trend of toward a lightweight and compact electronic device.

In view of the foregoing, there exist problems and disadvantages in the current hardware configurations that await further improvement. However, those skilled in the art sought vainly for a solution. In order to solve or circumvent above problems and disadvantages, there is an urgent need in the related field to improve the heat dissipation efficiency.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more various aspects, the present disclosure is directed to a power converter device that may be easily inserted into a DC/DC converter, and may be applicable or readily adaptable to all related technology (such as car power), thereby improving heat dissipation efficiency.

According to one embodiment of the present invention, a power converter device includes a printed wiring board assembly, a cold plate base and a shell plate assembly. The cold plate base is fastened under the printed wiring board assembly for dissipating heat generated by the printed wiring board assembly. The shell plate assembly having a top shell plate, a bottom shell plate, at least two side plates respectively mounted on the cold plate base in different orientations. The printed wiring board assembly and the cold plate base are enclosed with the shell plate assembly.

The cold plate base is an U-shaped cold plate base, the U-shaped cold plate base comprises a bottom plate and two sidewalls, and the two sidewalls are positioned at two opposing sides of the bottom plate.

The bottom plate has at least one fluid access port, at least one fluid passage mounted in the bottom plate, and the fluid passage is connected to the fluid access port.

The top shell plate is screwed on the top of the two sidewalls, the printed wiring board assembly is completely covered with the top shell plate, the bottom shell plate is screwed on a second surface of the bottom plate, and the two side plates are screwed on opposing sides of the two sidewalls.

According to another embodiment of the present invention, a power converter device includes a cold plate base, a spatial heat-dissipation structure and a printed wiring board assembly. The spatial heat-dissipation structure is mounted on the cold plate base. The printed wiring board assembly is fastened on the cold plate base. The printed wiring board assembly has a first surface and at least one electronic component disposed on the first surface, and the first surface faces the cold plate base. The spatial heat-dissipation structure can dissipates heat generated by the electronic component and further for conducting the heat to the cold plate base.

The cold plate base is an U-shaped cold plate base, the U-shaped cold plate base comprises a bottom plate and two sidewalls, the two sidewalls are positioned at two opposing sides of the bottom plate, two opposing edges of the printed wiring board assembly are fastened on the two sidewalls respectively, and the spatial heat-dissipation structure mounted on the first surface of the cold plate base.

The bottom plate has at least one fluid access port, at least one fluid passage mounted in the bottom plate, and the fluid passage is connected to the fluid access port for allowing the flow of the coolant liquid.

The spatial heat-dissipation structure comprises at least two cooling sinks positioned on the first surface of the cold plate base for containing the electronic component, wherein the electronic component comprises a transformer and a choke, and clearance among the electronic component and the cooling sinks is filled with heat conduction glue.

The fluid passage is a snake-shaped channel so that the coolant liquid flows in a Z-shaped pathway.

The electronic component further comprises a transistor erected on the first surface, a sidewall of the cooling sinks acts as a support wall, and a surface of the support wall is in direct contact with the transistor.

The power converter device of claim 10, further comprises a fastener for fastening the transistor on the surface of the support wall.

The fastener comprises a metal elastic clamp, one end of the metal elastic clamp is fastened on the bottom plate and another end of the metal elastic clamp is disposed against the transistor on the surface of the support wall.

The bottom plate has a clamping part, said one end of the metal elastic clamp is fastened in the clamping part and said another end of the metal elastic clamp is disposed against the transistor on the surface of the support wall.

One end of the metal elastic clamp is screwed on the bottom plate and another end of the metal elastic clamp is disposed against the transistor on the surface of the support wall.

The electronic component comprises a transformer, the spatial heat-dissipation structure comprises a cooling sink, and the cooling sink comprises a base, a container sink, a fluid channel and an upper cap. The base is mounted on the bottom plate. The container sink is positioned on the bottom plate for containing the transformer, wherein clearance between the transformer and the container sink is filled with heat conduction glue. The fluid channel is mounted on the bottom plate, disposed in a sidewall of the container sink, and connected to the fluid passage, wherein the fluid channel has an opening. The upper cap can enclose the opening of the fluid channel.

The electronic component further comprises a choke, the spatial heat-dissipation structure further comprises a heat-dissipation sink, and the heat-dissipation sink comprises a containing structure and a heat-dissipation fin. The containing structure can contain the choke, wherein clearance between the choke and the container sink is filled with heat conduction glue. The heat-dissipation fin is formed on a bottom surface of the containing structure and disposed in a portion of the fluid passage.

The electronic component further comprises at least one electronic part, and the bottom plate has at least one hollow portion positioned corresponding to the electronic part, wherein when the printed wiring board assembly operates, its main heat is generated by the transformer and the choke.

The electronic component further comprises a transistor erected on the first surface, a sidewall of the cooling sinks acts as a support wall, and a surface of the support wall is in direct contact with the transistor.

The power converter device further comprises a fastener for fastening the transistor on the surface of the support wall.

The fastener comprises a metal elastic clamp, one end of the metal elastic clamp is fastened on the bottom plate and another end of the metal elastic clamp is disposed against the transistor on the surface of the support wall.

The bottom plate has a clamping part, said one end of the metal elastic clamp is fastened in the clamping part and said another end of the metal elastic clamp is disposed against the transistor on the surface of the support wall.

One end of the metal elastic clamp is screwed on the bottom plate and another end of the metal elastic clamp is disposed against the transistor on the surface of the support wall.

Technical advantages are generally achieved, by embodiments of the present invention, as follows:
1. The heat dissipation efficiency is improved;
2. The space occupied by electronic components can be decreased; and
3. The power density can be increased.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawing, wherein.

DETAILED DESCRIPTION

Figure 1:
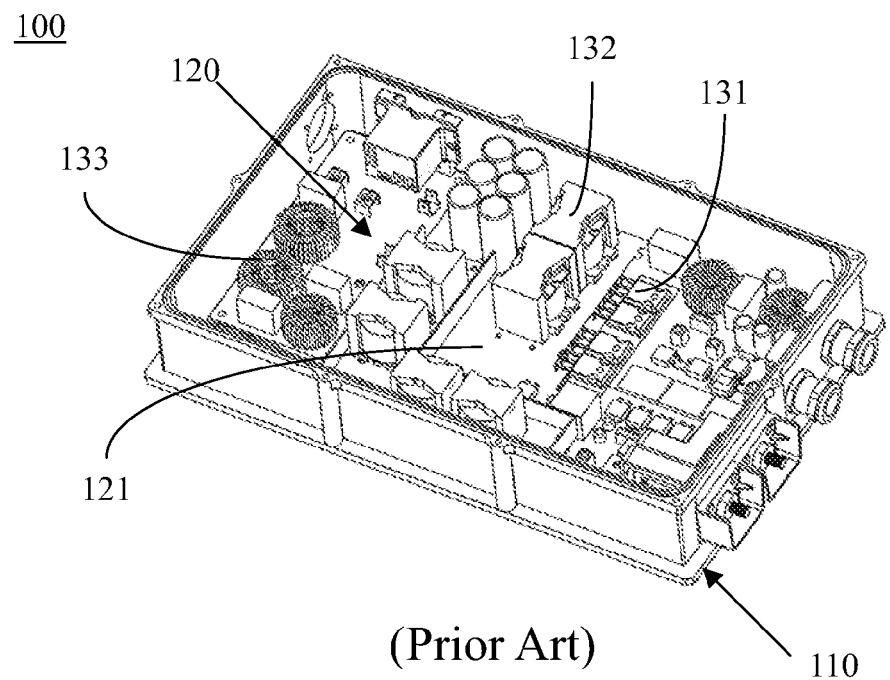
FIG. 1 is a stereogram of a conventional DC/DC converter.

In the following detailed description, for purposes of explanation, numerous specific details are set forth in order to attain a thorough understanding of the disclosed embodiments. It will be apparent, however, that one or more embodiments may be practiced without these specific details. In other instances, well-known structures and devices are schematically shown in order to simplify the drawing.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
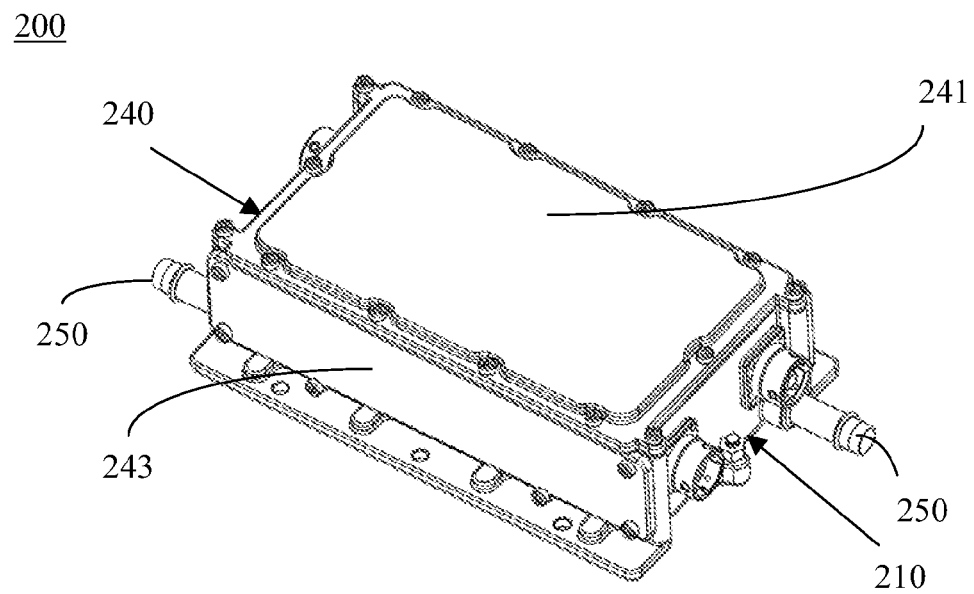
FIG. 2 illustrates an appearance of a power converter device according to one embodiment of the present disclosure.
Figure 3:
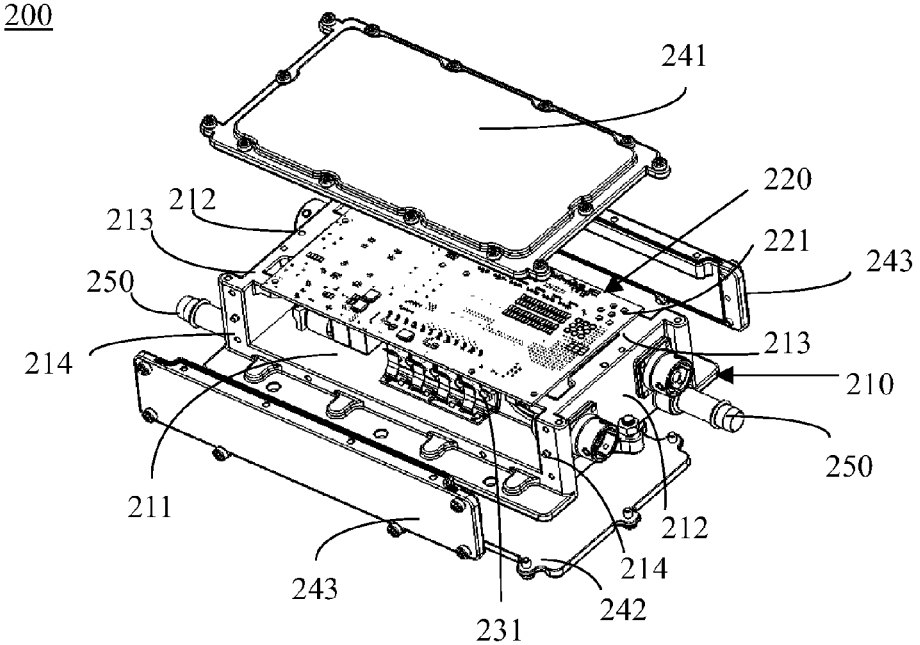
FIG. 3 is an explosion diagram of the power converter device of FIG. 2.

FIG. 2 illustrates an appearance of a power converter device 200 according to one embodiment of the present disclosure. FIG. 3 is an explosion diagram of the power converter device 200 of FIG. 2. As shown in FIGS. 2 and 3, the power converter device 200 includes a cold plate base 210 and a printed wiring board assembly 220. The printed wiring board assembly 220 is a power converter module. The first surface of the printed wiring board assembly 220 faces a first surface of the cold plate base 210, and the printed wiring board assembly 220 is flipped and mounted on the cold plate base 210, so that the cold plate base 210 can dissipate heat that is generated by electronic components (such as car power) on the first surface, thereby improving heat dissipation efficiency.

As shown in FIG. 3, the cold plate base 210 is an U-shaped cold plate base, the U-shaped cold plate base comprises a bottom plate 211 and two sidewalls 212, and the two sidewalls 212 are positioned at two opposing sides of the bottom plate 211, so that the two sidewalls 212 can support the printed wiring board assembly 220.

Moreover, the bottom plate 211 has at least one fluid access port 250, at least one fluid passage mounted in the bottom plate 211, and the fluid passage is connected to the fluid access port 250, so that the heat dissipation can be improved by means of fluid flow.

The power converter device 200 includes a shell plate assembly 240. The shell plate assembly 240 has a top shell plate 241, a bottom shell plate 242, and two side plates 243. The top shell plate 241, bottom shell plate 242, and the two side plates 243 are respectively mounted on the cold plate base 210 in different orientations. The top shell plate 241, bottom shell plate 242, and the two side plates 243 are individual to each other; after assembly, the printed wiring board assembly 220 and the cold plate base 210 are enclosed with the shell plate assembly 240.

Specifically, the top shell plate 241 is screwed on the top 213 of the two sidewalls 212, the printed wiring board assembly 220 is completely covered with the top shell plate 241, so as to protect the printed wiring board 221 and electronic components from damage. The bottom shell plate 242 is screwed on a second surface of the bottom plate 211, and the two side plates 243 are screwed on opposing sides 214 of the two sidewalls 212. This screwing manner can be accomplished by using screws and corresponding screw holes, so as to facilitate disassembly.

Figure 4:
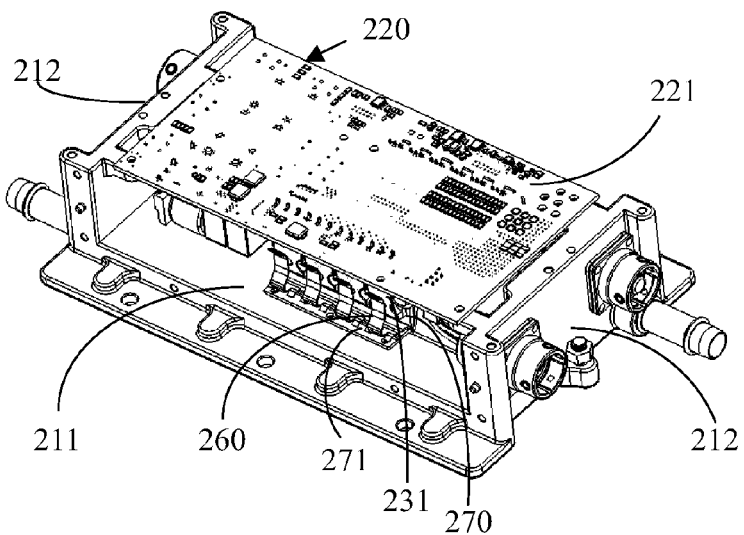
FIG. 4 illustrates a mounting structure of a transistor according to one embodiment of the present disclosure.
Figure 5:
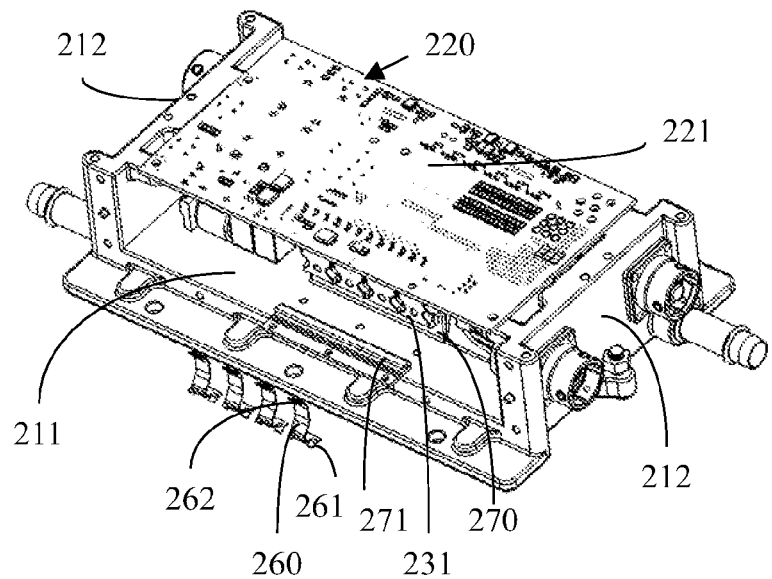
FIG. 5 is a breakdown drawing of FIG. 4.

FIG. 4 illustrates a mounting structure of a transistor 231 according to one embodiment of the present disclosure. FIG. 5 is a breakdown drawing of FIG. 4. As shown in FIGS. 4 and 5, the printed wiring board assembly 220 comprises at least one transistor 231. The transistor 231 is erected on the first surface of the printed wiring board 221. Compared with the levelly disposition, space occupied by transistor 231 can be decreased by this erective disposition.

The bottom plate 21 of the cold plate base 210 has a support wall 270. A surface of the support wall 270 is in direct contact with the transistor 231. In this embodiment, a fastener can be used for fastening the erective transistor 231 on the surface of the support wall 270, so as to facilitate heat dissipation.

Figure 10:
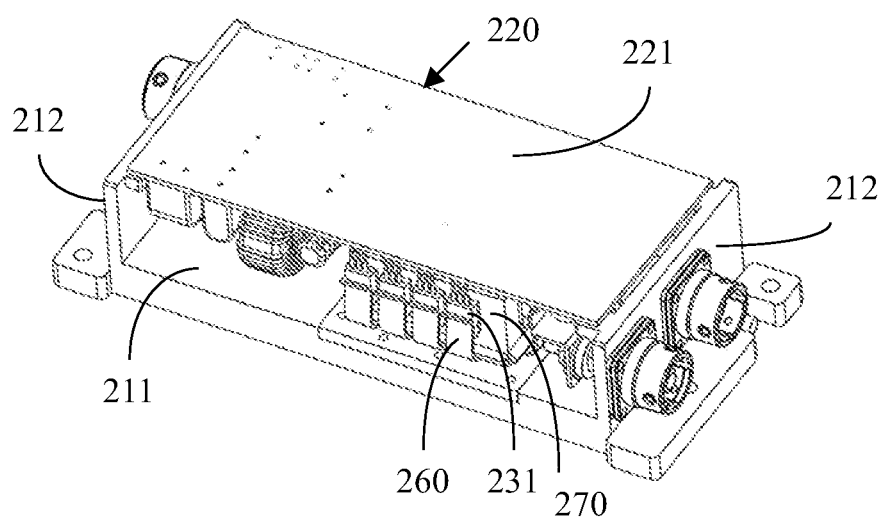
FIG. 10 is a stereogram of the cold plate base with a printed wiring board assembly according to one embodiment of the present disclosure.

In one embodiment as shown in FIG. 10, a sidewall of a spatial heat-dissipation structure 300 acts as above support wall 270. In this manner, the transistor 231 is positioned on the sidewall, and the spatial heat-dissipation structure 300 can dissipate heat generated by the transistor 231.

Turing to FIG. 5, the fastener comprises a metal elastic clamp 260, one end 261 of the metal elastic clamp 260 is fastened on the bottom plate 211 and another end 262 of the metal elastic clamp 260 is disposed against the transistor 231 on the surface of the support wall 270. In this embodiment, this elastic clamp can facilitate disassembly in use, its metal further the heat dissipation.

Moreover, the bottom plate 211 has a clamping part 270, said one end 261 of the metal elastic clamp 260 is fastened in the clamping part 270 and said another end 262 of the metal elastic clamp 260 is disposed against the transistor 231 on the surface of the support wall 270. In this embodiment, one end 261 of the metal elastic clamp 260 can be clasped at a hook portion of the clamping part 270, so as to facilitate disassembly and rework.

Figure 6:
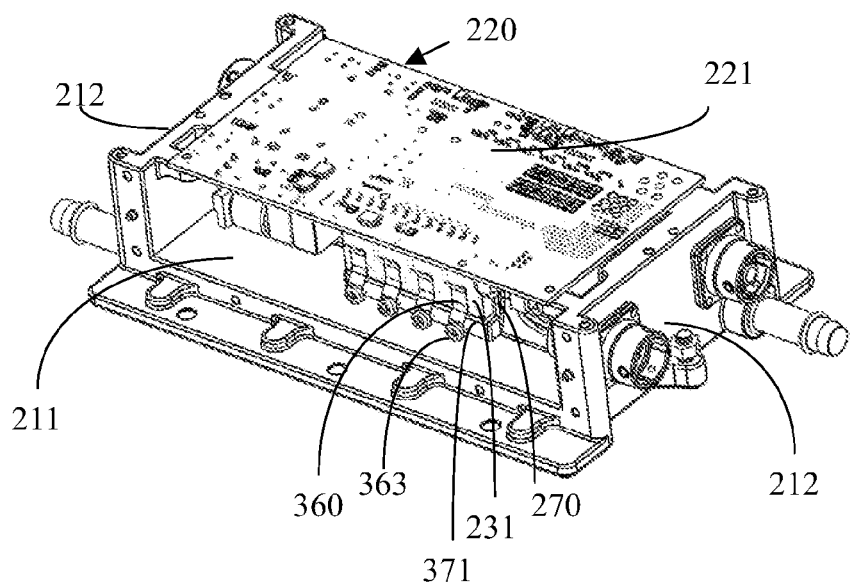
FIG. 6 illustrates a mounting structure of the transistor according to another embodiment of the present disclosure.
Figure 7:
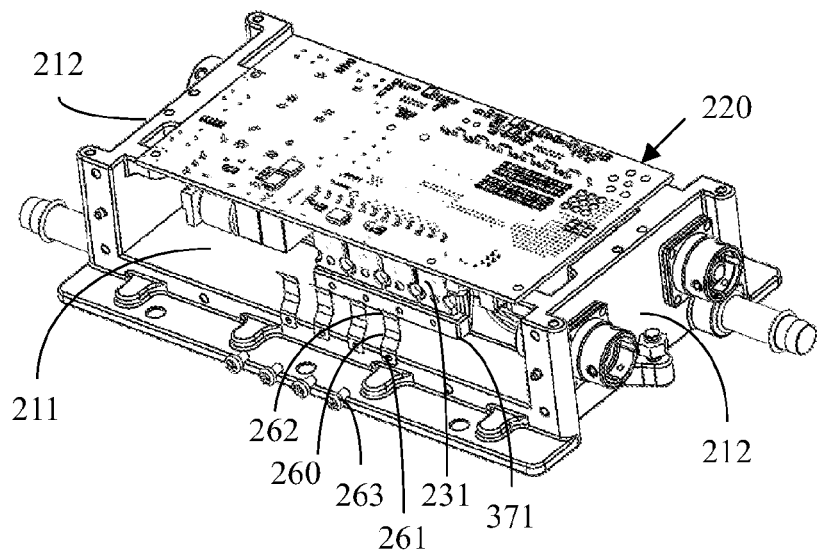
FIG. 7 is a breakdown drawing of FIG. 6.

FIG. 6 illustrates a mounting structure of the transistor 231 according to another embodiment of the present disclosure. FIG. 7 is a breakdown drawing of FIG. 6. Compared with FIGS. 4 and 5, FIGS. 6 and 7 illustrate that the fastener comprises a metal elastic clamp 360. One end 361 of the metal elastic clamp 360 is screwed on the bottom plate 211 and another end 362 of the metal elastic clamp 360 is disposed against the transistor 231 on the surface of the support wall 270. In this embodiment, the bottom plate 211 has a locking structure 371. The locking structure has screw hole, so that the end 361 of the metal elastic clamp 360 can be screwed on the locking structure 371 by using the screw 263 through the opening of the end 361.

Figure 8:
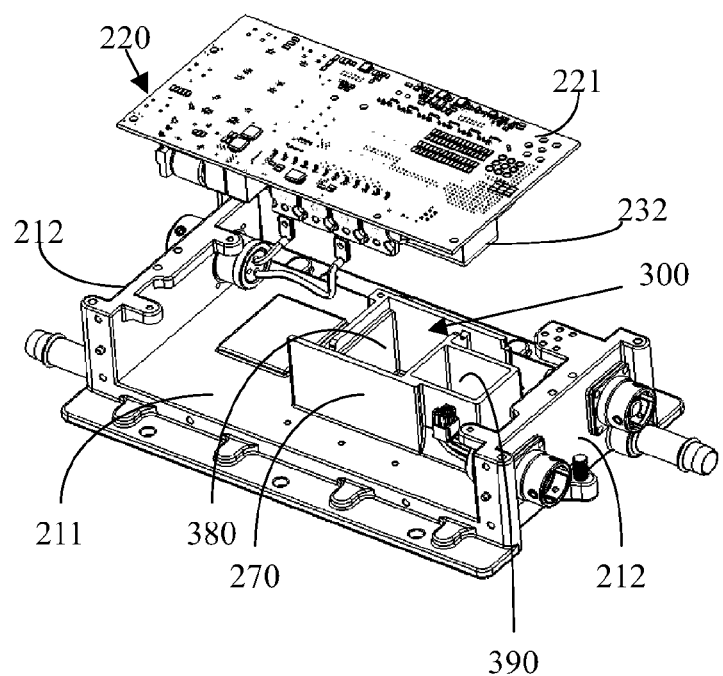
FIG. 8 illustrates a spatial heat-dissipation structure mounted on a cold plate base according to one embodiment of the present disclosure.

FIG. 8 illustrates a spatial heat-dissipation structure 300 mounted on a cold plate base 210 according to one embodiment of the present disclosure. In FIG. 8, the printed wiring board assembly 220 is fastened on the cold plate base 210, and the cold plate base 210 has at least one spatial heat-dissipation structure 300. The spatial heat-dissipation structure 300 contains at least one electronic component, such as a transformer, disposed on the first surface of the printed wiring board assembly 220. In this way, the spatial heat-dissipation structure 300 protects the electronic component from damage; furthermore, the spatial heat-dissipation structure 300 can dissipate heat generated by the electronic component and further for conducting the heat to the cold plate base 210. Specifically, the spatial heat-dissipation structure 300 comprises at least two cooling sinks 380 and 390 positioned on the first surface of the cold plate base 210 for containing the electronic component, wherein the electronic component may comprises a transformer and a choke, and clearance among the electronic component and the cooling sinks is filled with heat conduction glue for improving heat dissipation.

Figure 9:
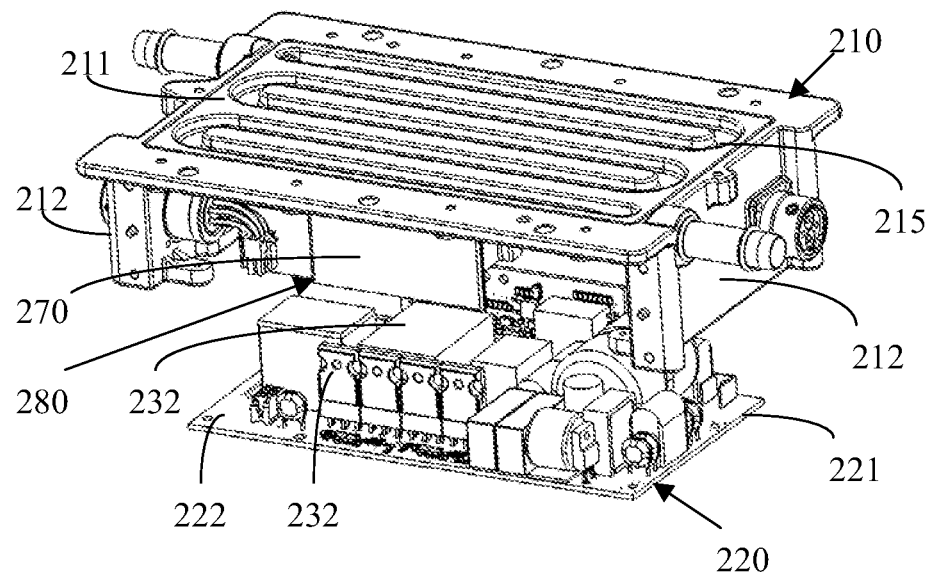
FIG. 9 illustrates a structure of the cold plate base according to one embodiment of the present disclosure.

FIG. 9 illustrates a structure of the cold plate base 210 according to one embodiment of the present disclosure. As shown in FIG. 9, the second surface of the cold plate base 210 has a snake-shaped channel 215 so that the coolant liquid flows in a Z-shaped pathway, thereby improving heat dissipation and reducing weight. The first surface of the printed wiring board assembly 220 faces the cold plate base 210. The electronic component, such as the transformer 232, is aligned with the spatial heat-dissipation structure 300. When the printed wiring board assembly 220 is flipped and mounted on the cold plate base 210, the spatial heat-dissipation structure 300 can contain the electronic component.

FIG. 10 is a stereogram of the cold plate base 210 with a printed wiring board assembly 220 according to one embodiment of the present disclosure. Referring to FIGS. 8 and 10, the sidewall of the cooling sink 380 of the spatial heat-dissipation structure 300 acts as above support wall 270. In this manner, the transistor 231 is positioned on the sidewall, and the spatial heat-dissipation structure 300 can dissipate heat generated by the transistor 231.

Figure 11:
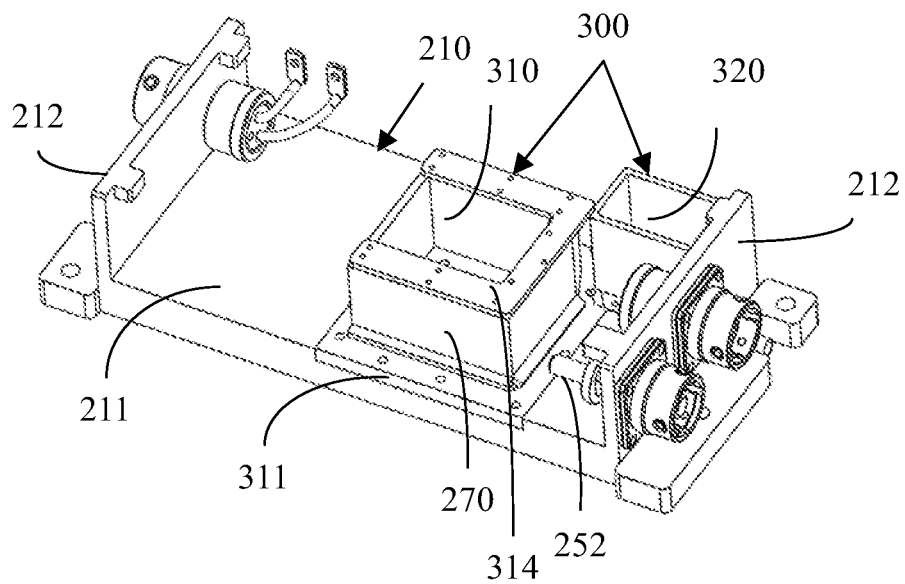
FIG. 11 illustrates a cold plate base according to another embodiment of the present disclosure.

FIG. 11 illustrates a cold plate base 210 according to another embodiment of the present disclosure. As shown in FIG. 11, two sidewalls 212 of the U-shaped cold plate base has at least one fluid access port 250, at least one fluid passage 252 is mounted in the bottom plate 211, and the fluid passage 252 is connected to the fluid access port 250 for allowing the flow of the coolant liquid.

Figure 12:
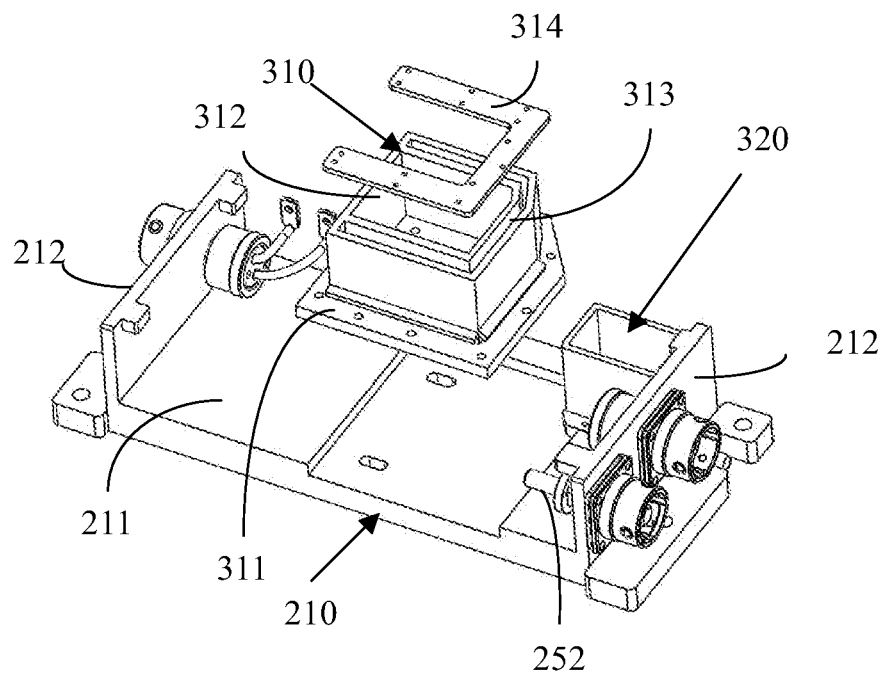
FIG. 12 is an explosion diagram of a cooling sink of FIG. 11.

FIG. 12 is an explosion diagram of a cooling sink 310 of FIG. 11. As shown in FIG. 12, the spatial heat-dissipation structure 300 comprises a cooling sink 310, and the cooling sink 310 comprises a base 311, a container sink 312, a fluid channel 313 and an upper cap 314. The base 311 is mounted on the bottom plate 211. The container sink 312 is positioned on the bottom plate 211 for containing the electronic component, such as transformer 232, wherein clearance between the transformer 232 and the container sink 312 is filled with heat conduction glue for improving heat dissipation. The fluid channel 313 is mounted on the bottom plate 211, disposed in a sidewall of the container sink 312, and connected to the fluid passage 252, wherein the fluid channel has an opening. The upper cap 314 can enclose the opening of the fluid channel 313, so as to prevent fluid in fluid channel 313 from flowing into the container sink 312.

The electronic component is aligned with the cooling sink 310. When the printed wiring board assembly 220 is flipped and mounted on the cold plate base 210, the cooling sink 310 can contain the electronic component. In this way, the fluid channel 313 can improve heat dissipation for the electronic component in the container sink 312.

In addition, a sidewall of the cooling sink 310 acts as above support wall 270. In this manner, the transistor 231 is positioned on the sidewall, and the fluid channel 313 can dissipate heat generated by the transistor 231.

Figure 13:
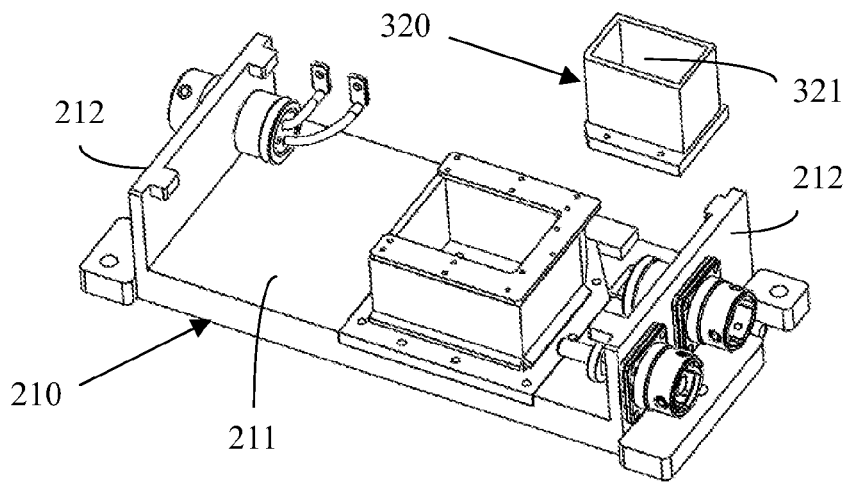
FIG. 13 is an explosion diagram of a heat-dissipation sink of FIG. 11.

FIG. 13 is an explosion diagram of a heat-dissipation sink 320 of FIG. 11. As shown in FIG. 13, the spatial heat-dissipation structure 300 comprises a heat-dissipation sink 320, and the heat-dissipation sink 320 comprises a containing structure 321. The containing structure 321 can contain the electronic component, such as a choke. The electronic component on the first surface is aligned with the heat-dissipation sink 320. When the printed wiring board assembly 220 is flipped and mounted on the cold plate base 210, the containing structure 321 is used for cooling the electronic component, wherein clearance between the choke and the container sink 320 is filled with heat conduction glue. In this way, the container sink 320 protects the electronic component from damage; furthermore, the container sink 320 can dissipate heat generated by the electronic component.

Figure 14:
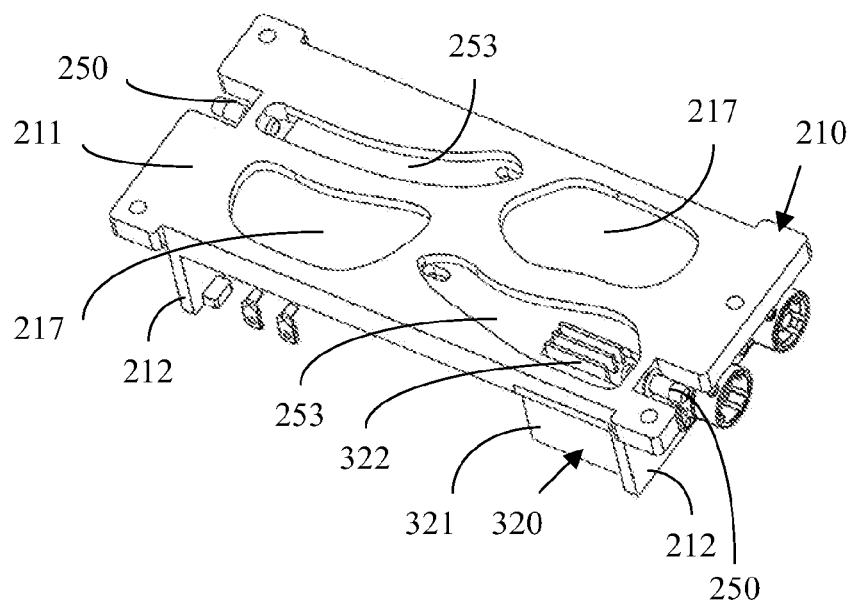
FIG. 14 illustrates a bottom structure of the cold plate base of FIG. 11.

FIG. 14 illustrates a bottom structure of the cold plate base 210 of FIG. 11. As shown in FIG. 14, the heat-dissipation sink 320 comprises a heat-dissipation fin 322. The heat-dissipation fin 322 is formed on a bottom surface of the containing structure 321 and disposed in a portion of the fluid passage 253. In use, the heat-dissipation fin 322 can further improve heat dissipation for the electronic component in the container sink 312. When fluid flows the heat-dissipation fin 322, the heat dissipation efficiency is more improved.

In the power converter device, the electronic component includes a transformer, a choke, a transistor, and another electronic parts (such as capacitors, resistors, etc.), and the bottom plate 210 has at least one hollow portion 217 positioned corresponding to the electronic part, wherein when the printed wiring board assembly 220 operates, its main heat is generated by the transformer 232 and the choke, and is greater than the heat generated by the electronic parts. In use, the hollow portion 217 can reduce weight.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A power converter device comprising:
    a cold plate base;
    a spatial heat-dissipation structure mounted on the cold plate base; and
    a printed wiring board assembly fastened on the cold plate base, the printed wiring board assembly having a first surface and at least one electronic component disposed on the first surface, the first surface facing the cold plate base, the spatial heat-dissipation structure for dissipating heat generated by the electronic component and further for conducting the heat to the cold plate base.

2. The power converter device of claim 1, wherein the cold plate base is an U-shaped cold plate base, the U-shaped cold plate base comprises a bottom plate and two sidewalls, the two sidewalls are positioned at two opposing sides of the bottom plate, two opposing edges of the printed wiring board assembly are fastened on the two sidewalls respectively, and the spatial heat-dissipation structure mounted on the first surface of the cold plate base.

3. The power converter device of claim 1, wherein the bottom plate has at least one fluid access port, at least one fluid passage mounted in the bottom plate, and the fluid passage is connected to the fluid access port for allowing the flow of the coolant liquid.

4. The power converter device of claim 3, wherein the spatial heat-dissipation structure comprises at least two cooling sinks positioned on the first surface of the cold plate base for containing the electronic component, wherein the electronic component comprises a transformer and a choke, and clearance among the electronic component and the cooling sinks is filled with heat conduction glue.

5. The power converter device of claim 4, wherein the fluid passage is a snake-shaped channel so that the coolant liquid flows in a Z-shaped pathway.

6. The power converter device of claim 4, wherein the electronic component further comprises a transistor erected on the first surface, a sidewall of the cooling sinks acts as a support wall, and a surface of the support wall is in direct contact with the transistor.

7. The power converter device of claim 6, further comprising:
    a fastener for fastening the transistor on the surface of the support wall.

8. The power converter device of claim 7, wherein the fastener comprises a metal elastic clamp, one end of the metal elastic clamp is fastened on the bottom plate and another end of the metal elastic clamp is disposed against the transistor on the surface of the support wall.

9. The power converter device of claim 8, wherein the bottom plate has a clamping part, said one end of the metal elastic clamp is fastened in the clamping part and said another end of the metal elastic clamp is disposed against the transistor on the surface of the support wall.

10. The power converter device of claim 8, wherein one end of the metal elastic clamp is screwed on the bottom plate and another end of the metal elastic clamp is disposed against the transistor on the surface of the support wall.

11. The power converter device of claim 3, wherein the electronic component comprises a transformer, and the spatial heat-dissipation structure comprises a cooling sink comprising:
   a base mounted on the bottom plate;
   a container sink positioned on the bottom plate for containing the transformer, wherein clearance between the transformer and the container sink is filled with heat conduction glue;
   a fluid channel mounted on the bottom plate, disposed in a sidewall of the container sink, and connected to the fluid passage, wherein the fluid channel has an opening; and
   an upper cap for enclosing the opening of the fluid channel.

12. The power converter device of claim 11, wherein the electronic component further comprises a choke, and the spatial heat-dissipation structure further comprises a heat-dissipation sink comprising:
   a containing structure for containing the choke, wherein clearance between the choke and the container sink is filled with heat conduction glue; and
   a heat-dissipation fin formed on a bottom surface of the containing structure and disposed in a portion of the fluid passage.

13. The power converter device of claim 12, wherein the electronic component further comprises at least one electronic part, and the bottom plate has at least one hollow portion positioned corresponding to the electronic part, wherein when the printed wiring board assembly operates, its main heat is generated by the transformer and the choke.

14. The power converter device of claim 11, wherein the electronic component further comprises a transistor erected on the first surface, a sidewall of the cooling sinks acts as a support wall, and a surface of the support wall is in direct contact with the transistor.

15. The power converter device of claim 14, further comprising:
   a fastener for fastening the transistor on the surface of the support wall.

16. The power converter device of claim 15, wherein the fastener comprises a metal elastic clamp, one end of the metal elastic clamp is fastened on the bottom plate and another end of the metal elastic clamp is disposed against the transistor on the surface of the support wall.

17. The power converter device of claim 16, wherein the bottom plate has a clamping part, said one end of the metal elastic clamp is fastened in the clamping part and said another end of the metal elastic clamp is disposed against the transistor on the surface of the support wall.

18. The power converter device of claim 16, wherein one end of the metal elastic clamp is screwed on the bottom plate and another end of the metal elastic clamp is disposed against the transistor on the surface of the support wall.

* * * * *